(12) United States Patent
Brien (10) Patent No.: US 10,438,823 B2
(45) Date of Patent: Oct. 8, 2019

(54) SUBSTRATE TREATMENT DEVICE

(71) Applicant: AIXTRON SE, Herzogenrath (DE)

(72) Inventor: Daniel Brien, Aachen (DE)

(73) Assignee: AIXTRON SE, Herzogenrath (DE)

( * ) Notice: Subject to any disclaimer, the term of this patent is extended or adjusted under 35 U.S.C. 154(b) by 729 days.

(21) Appl. No.: 14/913,229

(22) PCT Filed: Aug. 4, 2014

(86) PCT No.: PCT/EP2014/066692
§ 371 (c)(1),
(2) Date: Feb. 19, 2016

(87) PCT Pub. No.: WO2015/024762
PCT Pub. Date: Feb. 26, 2015

(65) Prior Publication Data
US 2016/0204008 A1    Jul. 14, 2016

(30) Foreign Application Priority Data
Aug. 23, 2013 (DE) .................. 10 2013 109 155

(51) Int. Cl.
*H01L 21/67* (2006.01)
*C23C 16/30* (2006.01)
(Continued)

(52) U.S. Cl.
CPC ...... *H01L 21/67103* (2013.01); *C23C 16/301* (2013.01); *C23C 16/4583* (2013.01);
(Continued)

(58) Field of Classification Search
CPC ......... H01L 21/67103; H01L 21/68771; H01L 21/67248; H01L 21/68764; C23C 16/301;
(Continued)

(56) References Cited

U.S. PATENT DOCUMENTS 6,160,242 A    12/2000   Guardado
6,492,625 B1 *  12/2002   Boguslavskiy ......... C23C 16/46
                                                                    118/725
(Continued)

FOREIGN PATENT DOCUMENTS

DE         69906087 T2    12/2003
DE       102007027704 A1  12/2008
(Continued)

OTHER PUBLICATIONS

International Search Report and Written Opinion dated Oct. 7, 2014, from the European Patent Office, for International Patent Application No. PCT/EP2014/066692 (filed Aug. 4, 2014), 15 pages.
(Continued)

*Primary Examiner* — Dana Ross
*Assistant Examiner* — Joseph M Baillargeon
(74) *Attorney, Agent, or Firm* — Ascenda Law Group, PC (57) ABSTRACT

A heating apparatus includes a plurality of zone heating apparatuses and a control apparatus. The reference variable of the control apparatus is a susceptor temperature. The controlled variable of the control apparatus is an actual temperature of the susceptor measured by a temperature sensor and the manipulated variable of the control apparatus is the total heating power fed into the heating apparatus. A heating power distributor receives the total heating power as an input variable and provides a zone heating power for each of the zone heating apparatuses as output variables. The sum of the zone heating powers corresponds to the total heating power and the zone heating powers have a specified ratio with respect to each other. In order to specify a robust control loop, the specified ratios are defined by distribution parameters, wherein at least one distribution parameter is a quotient of two zone heating powers.

11 Claims, 3 Drawing Sheets

(51) Int. Cl.
    C23C 16/458    (2006.01)
    C23C 16/46     (2006.01)
    C23C 16/52     (2006.01)
    C30B 25/10     (2006.01)
    C30B 25/16     (2006.01)
    G05D 23/19     (2006.01)
    H01L 21/687    (2006.01)
    H05B 1/02      (2006.01)
    H05B 6/06      (2006.01)
    H05B 6/10      (2006.01)
    C30B 29/40     (2006.01)

(52) U.S. Cl.
    CPC .............. *C23C 16/46* (2013.01); *C23C 16/52* (2013.01); *C30B 25/10* (2013.01); *C30B 25/16* (2013.01); *G05D 23/1917* (2013.01); *H01L 21/67248* (2013.01); *H01L 21/68764* (2013.01); *H01L 21/68771* (2013.01); *H05B 1/0233* (2013.01); *H05B 6/06* (2013.01); *H05B 6/105* (2013.01); *C30B 29/40* (2013.01)

(58) Field of Classification Search
    CPC ..... C23C 16/4583; C23C 16/46; C23C 16/52; C30B 25/10; C30B 25/16; C30B 29/40; G05D 23/1917; H05B 1/0233; H05B 6/06; H05B 6/105; H05B 6/065; H05B 6/062; H05B 6/362; H05B 6/1272
    USPC .... 219/634, 497, 486, 485, 483, 482, 446.1, 219/448.12, 635, 620, 622, 663, 452.12, 219/481, 468.1, 385; 438/5
    See application file for complete search history.

(56) References Cited

U.S. PATENT DOCUMENTS

| | | | |
|---|---|---|---|
| 6,746,908 B2 | 6/2004 | Tanaka et al. | |
| 2006/0027169 A1 | 2/2006 | Tsukamoto et al. | |
| 2006/0054088 A1* | 3/2006 | Jagawa | C23C 16/455 118/715 |
| 2007/0010033 A1* | 1/2007 | Aderhold | C23C 16/52 438/14 |
| 2007/0125762 A1* | 6/2007 | Cui | H01L 21/67103 219/444.1 |
| 2008/0092812 A1 | 4/2008 | McDiarmid et al. | |
| 2011/0073039 A1 | 3/2011 | Colvin | |
| 2011/0143016 A1 | 6/2011 | Hong et al. | |
| 2011/0259879 A1 | 10/2011 | Hanawa et al. | |
| 2012/0067870 A1 | 3/2012 | Lasko | |
| 2012/0148760 A1 | 6/2012 | Egami et al. | |
| 2012/0156396 A1* | 6/2012 | Strauch | C23C 16/46 427/587 |
| 2012/0193765 A1 | 8/2012 | Kelekar | |
| 2012/0221138 A1 | 8/2012 | Hong | |
| 2015/0132863 A1* | 5/2015 | Oohashi | H01J 37/32082 438/5 |

FOREIGN PATENT DOCUMENTS

| | | |
|---|---|---|
| DE | 102012101717 A1 | 9/2013 |
| EP | 1647868 B1 | 8/2011 |
| EP | 2557591 A1 | 2/2013 |
| WO | 2011/022637 A1 | 2/2011 |

OTHER PUBLICATIONS

International Preliminary Report on Patentability dated Feb. 23, 2016, from The International Bureau of WIPO, for International Patent Application No. PCT/EP2014/066692 (filed Aug. 4, 2014), 19 pages.

International Search Report dated Oct. 7, 2014, from the ISA/EPO, for International Patent Application No. PCT/EP2014/066692 (filed Aug. 4, 2014), English translation, 2 pages.

Written Opinion dated Oct. 7, 2014, from the ISA/EPO, for International Patent Application No. PCT/EP2014/066692 (filed Aug. 4, 2014), English translation, 10 pages.

* cited by examiner

SUBSTRATE TREATMENT DEVICE

RELATED APPLICATIONS

This application is a National Stage under 35 USC 371 of and claims priority to International Application No. PCT/EP2014/066692 filed 4 Aug. 2014, which claims priority to DE Application No. 10 2013 109 155.5 filed 23 Aug. 2013, which is incorporated herein by reference.

FIELD OF THE INVENTION

The invention relates to a device for treating substrates, comprising a susceptor which is disposed in a process chamber and has a first side that faces towards the process chamber for receiving at least one substrate, and a second side which faces away therefrom and can be heated by a heating apparatus having a plurality of zone heating apparatuses, and comprising a control apparatus, the reference variable of which is a susceptor temperature, the control variable of which is an actual temperature of the susceptor measured by means of a temperature measuring apparatus and the manipulated variable of which is a value for the total heating power $P_{tot}$ fed into the heating apparatus.

The invention further relates to a method for treating substrates, in which at least one substrate is disposed on a first side of a susceptor disposed in a process chamber, the susceptor's second side facing away from the first side being heated by a heating apparatus having a plurality of zone heating apparatuses, wherein the heating power fed into the heating apparatus is controlled by a control apparatus, the reference variable of which is a susceptor temperature, the control variable of which is an actual temperature of the susceptor measured by means of a temperature measuring apparatus, and the manipulated variable of which is a value for the heating power fed into the heating apparatus.

BACKGROUND

US 2011/0143016 A1 describes a device comprising two zone heating apparatuses which are disposed concentrically about the contour axis of a susceptor and which are supplied with heating power from a controller. The susceptor is rotationally driven about the center axis thereof.

US 2011/0259879 A1 describes a device for treating substrates in which a plurality of individually heatable zone heating apparatuses are provided below the susceptor.

U.S. Pat. No. 6,746,908 B2 describes a device for controlling a temperature in which a plurality of heating zones, which are disposed locally next to one another and influence one another thermally, are in each case controlled individually. The number of temperature sensors is greater than the number of heating zones. In the case of EP 1 647 868 B1, a plurality of heating zones influencing one another are heated by individual heating elements. Each heating zone is associated with a temperature measuring sensor. The individual heating apparatuses interfere with one another. The interference factors are compensated by forming a decoupling matrix.

WO 2011/022637 A1 describes heating devices in which the susceptor can be heated with lamps, with a resistance heater or inductive heating elements. The temperature of the susceptor surface is, inter alia, to be measured pyrometrically.

Devices for heating susceptors by means of FR coils are known, inter alia, from US 2012/0148760 A1, US 2012/0193765 A1 and US 2012/0067870 A1.

DE 10 2007 027 704 A1 describes a device of the aforementioned kind in which a plurality of zones can be heated with individual zone heating apparatuses, wherein here the zone heating apparatuses are formed by resistance wires which are able to absorb powers that differ from one another.

DE 10 2012 101 717 A1 describes a device and a method in which each individual zone heater is controlled by an individual control apparatus. Each control apparatus obtains actual values of a selection of temperature sensors.

DE 699 06 082 T2 describes a temperature control for a plurality of heating elements. Here too, each heating element is controlled individually in order to minimize a temperature gradient.

U.S. Pat. No. 6,492,625 B1 discloses a device and a method in which the substrate temperature is measured with a plurality of pyrometers. The measured values are linked with each other. Therefrom, reference variables are formed so that a plurality of zone heating apparatuses can be controlled individually.

US 2006/0027169 A1 describes a method for temperature-controlling a susceptor, wherein a plurality of heat exchangers is controlled by a common control apparatus.

US 2008/0092812 A1 describes a susceptor comprising a multiplicity of heaters, each of which is controlled by an independent controller. A reactor comprising individually adjustable heating zones is also described in US 2011/0073039 A1. Here too, an independently controlled heating power is fed into the individual heating zones.

US 2012/0221138 A1 describes a device in which a plurality of temperature sensors provides temperature measurements from various places of the substrate surface. A heating apparatus which is disposed below the susceptor and is supplied with power by a control apparatus corresponds to each temperature sensor. A main control apparatus coordinates the individual control apparatuses.

U.S. Pat. No. 6,160,242 A describes the use of lamps by means of which a substrate is heated. Provided is a plurality of optical temperature sensors which deliver the input values for a control apparatus by means of which the heat lamps are controlled.

SUMMARY OF THE INVENTION

It is an object of the invention to provide a more robust control loop by means of which a plurality of devices having zone heating apparatuses can be adapted to changing parameters.

The object is achieved by the invention as defined in the claims. The control apparatus according to the invention provides a value for power fed into a heating apparatus as a manipulated variable, wherein the heating apparatus has a plurality of zone heating apparatuses. According to the invention, the manipulated variable output by the control apparatus is an input variable of a heating power distributor. The heating power distributor is capable of dividing the total heating power fed as input variable to the heating power distributor into different zone heating powers, wherein the values of the zone heating powers have a predetermined fixed ratio with respect to one another. Each zone heating power is fed into its associated zone heating apparatus, wherein the sum of the zone heating powers corresponds to the total heating power which is distributed among the individual zone heating apparatuses. Preferably, the heating apparatus has an uneven number of zone heating apparatuses, wherein then preferably in each case two zone heating apparatuses are coupled to one another as a pair via a distribution parameter. The distribution parameter can indicate the quotient of the values of the zone heating powers which are fed into the two zone heating apparatuses of a pair of zone heating apparatuses. The distribution parameters are substantially freely preselectable. Due to the free preselectability of the distribution parameters, the heating power distribution can be adapted to different process parameters such as the thermal conductivity of the process gas or carrier gas fed into the process chamber. The control loop is particularly robust because it provides only one manipulated variable, which is the total heating power fed into the heating apparatus. The total heating power is distributed among the individual heating zones according to distribution parameters which, for example, are determined in preliminary tests and are set before the coating process. The distribution parameters have otherwise no influence on the control. The distribution parameters are preferably not changed during a coating process. They are not changed even if the substrate temperature is changed along a specified temperature-time law, thus a temperature ramp is implemented, for example.

In a particularly preferred configuration, the temperature of the susceptor is measured using only one temperature measuring apparatus, for example a thermocouple. Measuring the susceptor temperature can also be performed pyrometrically. The temperature of the susceptor can be measured at the side thereof facing towards the process chamber side, but also at the side thereof facing towards the heating apparatus. The zone heating apparatuses can be RF coils or RF coil elements. The susceptor preferably has the shape of a circular disk and has a central contour axis. The zone heating apparatuses are preferably disposed concentrically about the contour axis of the susceptor. On the susceptor's side facing towards the process chamber, there are substrate holders which, for example, can be formed by recesses of the surface of the susceptor into which the circular-disk-shaped substrates can be placed. The latter are preferably semiconductor substrates which are coated in the process chamber with a semiconductor layer. The substrate holders are disposed in a ring zone about the contour axis of the susceptor. A particularly preferred variant, in which three zone heating apparatuses are provided, has the following properties: A first zone heating apparatus is provided which extends below the centers of the substrate holders. This central zone heating apparatus is flanked on its radially inner side and its radially outer side in each case by a further zone heating apparatus. The radially inner zone heating apparatus extends beyond the edge of the ring zone that is taken by the substrate holders. The radially outer zone heating apparatus also extends beyond the periphery of the ring zone in which the substrate holders are disposed. The peripheral zone heating apparatus and the central zone heating apparatus are minimally spaced apart from one another. In a preferred configuration of the invention, the substrate holders are formed by plates which lie in pockets of the susceptor and which are rotated about their axis during the treatment process. In a preferred configuration of the invention, the inner and the outer zones are coupled to one another. The power fed into these two zones has a fixed preselectable ratio. The zone heating power fed into the middle zone heating apparatus has a predefinable ratio to the total power, which is the sum of all zone heating powers, that is fed into the heating apparatus. The total power is varied by the controller in order to adjust the temperature measured by the temperature measuring apparatus to the specified susceptor temperature. In the case of an uneven number of zone heating apparatuses, there is a central zone heating apparatus extending along the circular-arc-shaped center line of the growth zone. Further zone heating apparatuses are disposed in pairs and symmetrically with respect to the middle zone heating apparatus in the region of the growth zone. The growth zone is in particular the ring-shaped region of the susceptor in which the substrates are located from a minimum radius up to a maximum radius.

Rotationally driven substrate holders have the following advantages: When the substrate holders rotate about their own axis, a substantially rotationally symmetric temperature profile establishes on the substrate holders. The temperatures in the edge zone of the substrate holder are substantially determined by the zone heating powers which are fed into the inner and outer zone heating apparatuses, respectively. The central temperature on the substrate holder, however, is substantially determined by the heating power that is fed into the middle zone heating apparatus. By increasing the portion of the total heating power that is fed into the middle zone heating apparatus, the temperature in the middle of the surface of the substrate holder can be increased. While according to a preferred configuration of the invention the coupling of the zone heating powers fed into the outer and inner zone heating apparatuses is constant, the heating power of the middle zone heating apparatus is to be freely selectable independently of this coupling parameter. The value of this distribution parameter is substantially a function of the composition of the gas in the process chamber, in particular of the thermal property thereof. The distribution parameter is preferably used to increase or decrease the temperature in the middle as needed. Preferably, a coating process is performed in the process chamber in which process gases, which degrade pyrolitically, are introduced into the process chamber. The degradation products are deposited as a layer on the surfaces of the substrates. Preferably, this is a MOCVD process. With the method according to the invention, it is also possible to implement temperature ramps, for example in that the set point of the susceptor temperature is a function of time. Thus, it is possible to continuously increase the temperature over time. In the process of this, the distribution parameters are preferably not changed.

The zone heating apparatuses are preferably formed by water-cooled induction coils which are disposed in a spiral manner on the bottom side of the susceptor. The individual windings of the spiral coils are spaced apart from one another, wherein said spacing corresponds approximately to the spacing at which adjacent zone heating apparatuses are spaced apart from one another. Thus, adjacent zone heating apparatuses adjoin each other directly. For example, their radial spacing is less than their spacing from the second side of the susceptor. This ensures that the heating apparatus provides the susceptor with a heat flow that is entirely stepless without temperature jumps.

BRIEF DESCRIPTION OF THE DRAWINGS

Exemplary embodiments of the invention are explained below with reference to the accompanying drawings. In the figures.

DETAILED DESCRIPTION

Figure 1:
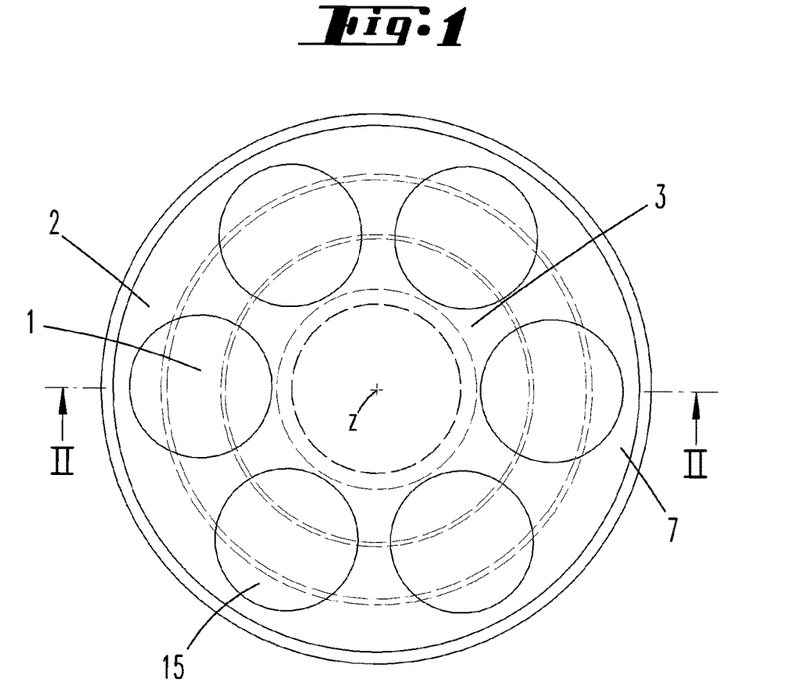
FIG. 1 shows a top view of a circular-disk-shaped susceptor on which six substrate holders 8 are disposed, each of which is fitted with a substrate 15; the zone heating apparatuses 1, 2, 3 disposed below the susceptor 7 and extending annularly about the center Z of the susceptor 7 are illustrated in dashed lines.
Figure 2:
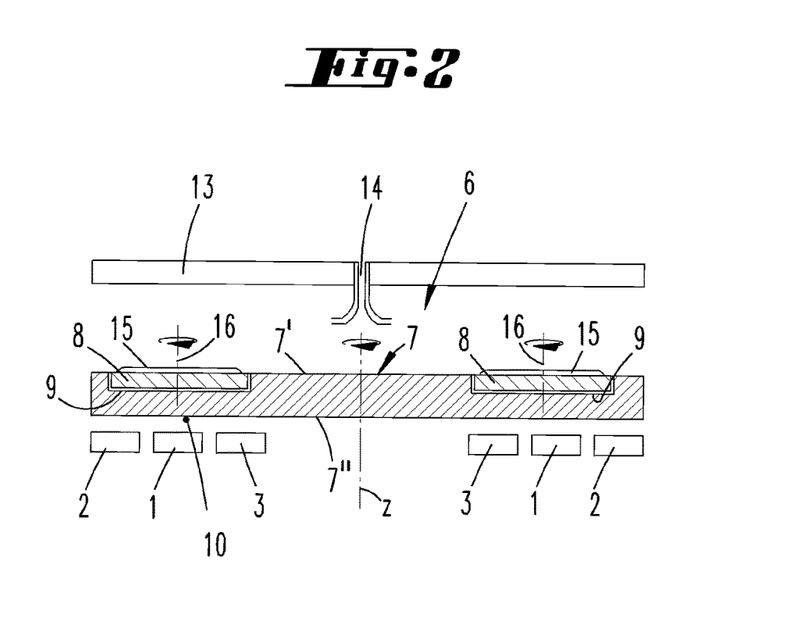
FIG. 2 shows a section according to the line II-II.

The exemplary embodiment concerns a MOCVD reactor. In a non-illustrated reactor housing, which is gas-tight with respect to the outside, a susceptor 7 is located which has the shape of a circular disk and is rotationally driven about its axis Z. The center of the susceptor is situated in a gas inlet zone in which process gases are fed into the process chamber 6 through a gas inlet member 14. In a growth zone extending annularly about the gas inlet zone there are altogether six substrate holders 8 in the exemplary embodiment. The substrate holders lie in pockets 9 of the top side 7' of the susceptor 7. Means are provided by means of which the substrate holders 8 can be rotationally driven about their rotation axis 16. For this purpose, the circular-disk-shaped substrate holders 8 preferably lie on a gas cushion formed by a carrier gas that is fed from below into the pockets 9. By means of the carrier gas, a rotational movement can be imposed on the substrate holders 8. On each of the substrate holders 8 there is a substrate 15 to be coated. A process chamber ceiling 13, which can be cooled, is located above the process chamber 6. The gas inlet member 14 extends out of the center of the process chamber ceiling 13 towards the susceptor 7 and has a plurality of gas outlet openings through which, for example, gases with elements of the main groups III and V can be introduced into the process chamber 6. These process gases, which are introduced into the process chamber together with a carrier gas, for example hydrogen or nitrogen, degrade in the gas phase but also on the surface of the substrate 15, wherein a III-V-layer is deposited on the substrates 15. The carrier gas and the reaction products are discharged from the process chamber 6 by means of a vacuum pump, which is not illustrated.

Below the susceptor 7, thus below the bottom side 7" of the susceptor 7, there is a plurality of zone heating apparatuses disposed annularly about the center Z. In the exemplary embodiment illustrated in the FIGS. 1 to 3, three zone heating apparatuses 1, 2, 3 are provided, and five zone heating apparatuses 1, 2, 3, 4 and 5 are provided in the exemplary embodiment illustrated in the FIGS. 4 and 5.

The zone heating apparatuses can be resistance heaters or induction heaters. However, the heating apparatuses 1 to 5 are preferably induction coils which are disposed about the center Z in the manner of a spiral winding or concentric winding. All zone heating apparatuses 1 to 5 are disposed in one plane, wherein adjacent zone heating apparatuses 1 to 5 are situated next to each other as close as possible.

Provided is a central zone heating apparatus 1 which extends annularly below the centers 16 of the substrate holder 8. In the region of this zone heating apparatus 1, the temperature of the susceptor 7 is also measured using a temperature measuring apparatus 10. In the exemplary embodiment, the temperature measuring apparatus 10 is illustrated as a thermocouple which is located at the bottom side 7" of the susceptor 7. The susceptor temperature can also be measured pyrometrically and in particular by means of a "light pipe". A plurality of temperature measuring apparatuses 10 can be provided, which measure the temperature of the susceptor 7 at different radial positions or at different circumferential positions. If the susceptor temperature is measured at different circumferential positions, the measurement is preferably performed at the same radial spacing so that temperature averaging can be carried out. Preferably, the apparatus has only one temperature measuring apparatus 10 and/or the susceptor temperature is measured at only one radial position, but optionally by means of a plurality of individual temperature measuring apparatuses. The measurement is preferably carried out on the circular arc line on which the centers 16 of the substrate holders 8 are located.

In the exemplary embodiment illustrated in the FIGS. 1 to 3, there is a radially inner zone heating apparatus 3 extending below the radially inner periphery of the growth zone, in addition to the central zone heating apparatus. The zone heating apparatus 3 extends substantially below the growth zone, thus below the substrate holder 8; however, an edge portion thereof extends also below the inlet zone, thus a zone that is not taken by a substrate holder 8.

Radially outside of the middle zone heating apparatus 1 there is a radially outer zone heating apparatus 2, which likewise is located substantially below the growth zone, i.e., below the region of the susceptor side 7' taken by the substrate holders 8. However, here too, a portion of the zone heating apparatus 2 extends outside of the growth zone, thus outside of the region that is taken by the substrate holders 8.

Figure 4:
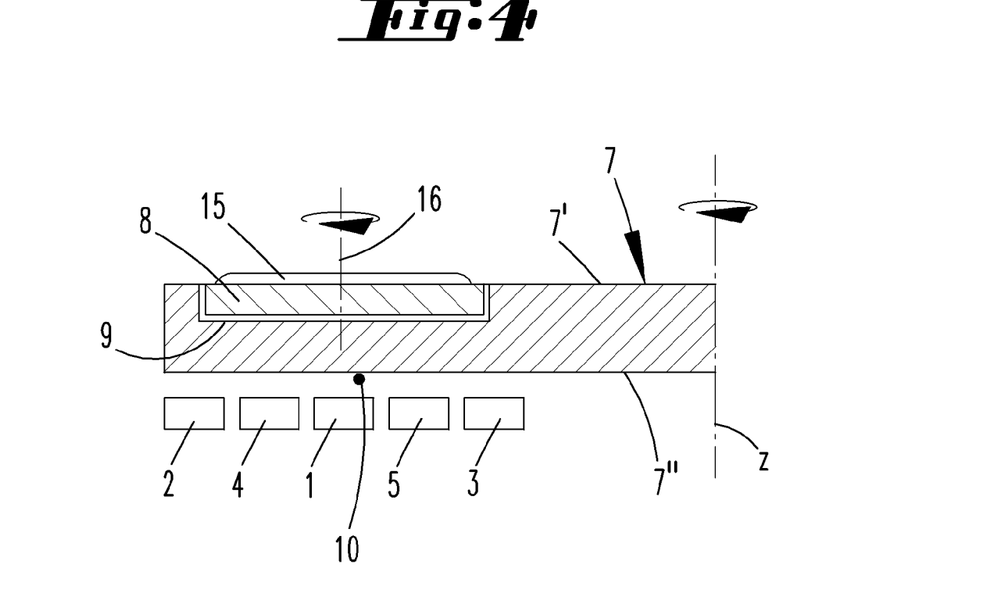
FIG. 4 shows an illustration similar to FIG. 2 of a second exemplary embodiment.
Figure 5:
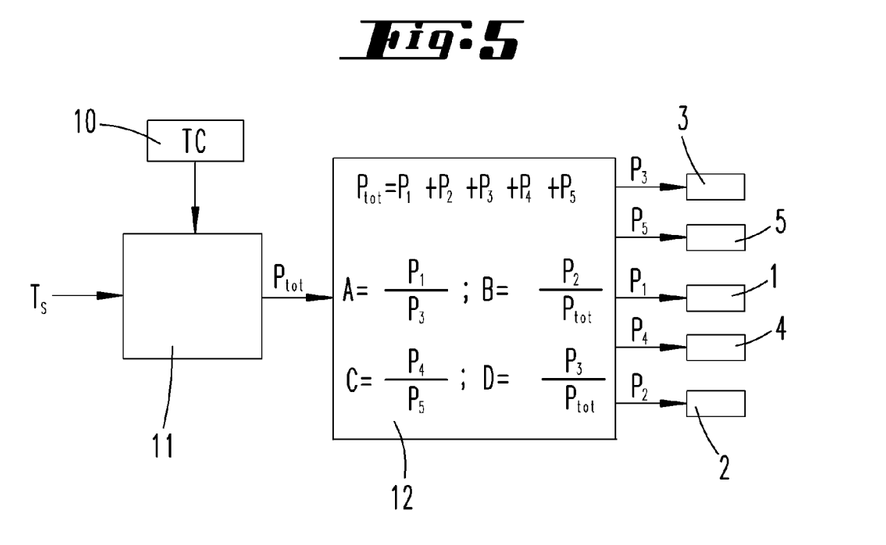
FIG. 5 shows the block diagram of a control apparatus of the second exemplary embodiment.

In the exemplary embodiment illustrated in the FIGS. 4 and 5, there is another zone heating apparatus 4 situated between the radially outer zone heating apparatus 2 and the central zone heating apparatus 1. Another zone heating apparatus 5 is situated between the middle zone heating apparatus 1 and the radially inner zone heating apparatus 3.

The two outer zone heating apparatuses 2, 3 form in each case a pair. Likewise, the zone heating apparatuses 4 and 5 disposed between the outer zone heating apparatuses 2 and 3 and the middle zone heating apparatus 1 form a pair.

Figure 3:
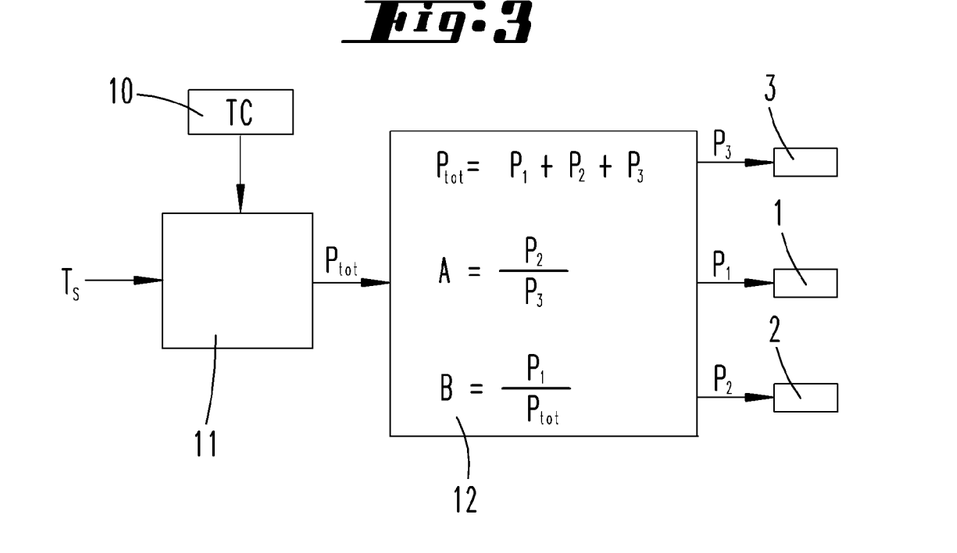
FIG. 3 shows a block diagram of a control apparatus of the first exemplary embodiment.

FIG. 3 shows a control apparatus by means of which the zone heating apparatuses 1, 2, 3 are supplied with heating power. The reference variable is a specified substrate temperature $T_S$. The temperature measured by the temperature measuring apparatus 10 is to be adjusted to this reference variable. For this purpose, the controller 11 outputs a total heating power $P_{tot}$ to a heating power distributor 12.

The controller can be a PID controller. In the heating power distributor, the total heating power $P_{tot}$ is distributed as zone heating power $P_1$, $P_2$, $P_3$ among the individual zone heating apparatuses 1, 2, 3. For this purpose, distributor parameters A, B are used which are found through preliminary tests or simulation calculations. The distribution parameters are substantially freely selectable and are different for different process conditions such as, for example, different total pressures or gas compositions. They are substantially a function of the specific thermal conductivity of the carrier gas used and of the geometry adjacent to the inner and outer edges of the susceptor. A first distribution parameter A corresponds to the quotient of the powers fed into the outer zone heating apparatuses 2, 3. Thus, it corresponds to a loss ratio of the inner to the outer surface.

$$A = \frac{P_2}{P_3}$$

A second distribution parameter B determines the portion of the total power that is fed into the middle zone heating apparatus 1.

$$B = \frac{P_1}{P_{tot}}$$

With the distribution parameter A, the effect of the heating apparatus on the edge region of the substrate holder 8, thus on the edge of the substrate 15 resting thereon can be influenced. With the distribution parameter B, the power fed into the center of the rotating substrate is leveled. Thus, the center temperature of the substrate 15 can be increased by increasing the distribution parameter B and can be decreased by decreasing the distribution parameter B, respectively.

Figure 6:
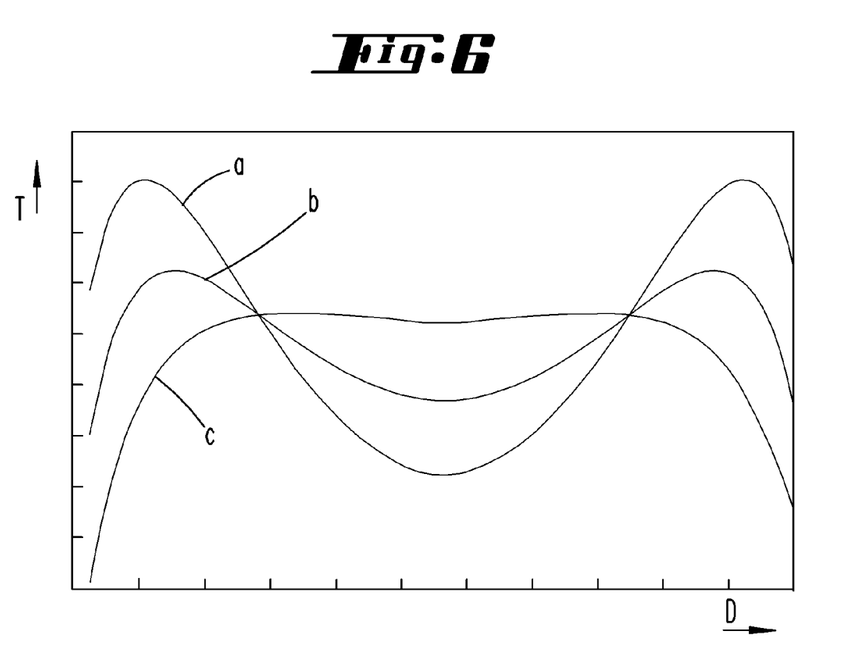
FIG. 6 shows a schematic illustration of the surface temperature occurring over the diameter of a substrate holder 8 at different distribution parameters B.

FIG. 6 shows three temperature curves a, b, c which illustrate the surface temperature of substrate holder 8 that is heated from below. Curve a shows an energy supply with the distribution parameter B having a low value. It is apparent that the surface temperature in the middle of the substrate holder 8 is lower than at the edge.

Curve b shows the temperature progression over the diameter of a substrate holder 8 with the distribution parameter B being increased. Since the total heating power $P_{tot}$ remains constant, less power is fed into the edge regions, i.e., in the peripheral zone heating apparatus 2, 3, than was the case for curve a. Accordingly, the difference between edge temperature and center temperature has decreased.

Curve c shows how the surface temperature in the center of the substrate holder 8 can be further increased if the distribution parameter B is increased. Since here too, the total power $P_{tot}$ is kept constant, the power $P_2$, $P_3$ fed into the peripheral zone heating apparatuses 2 and 3 has decreased.

Here, the distribution parameter A is kept constant.

In the exemplary embodiment illustrated in the FIGS. 4 and 5, not only the two peripheral zone heating apparatuses 2 and 3 are coupled via a distribution parameter so as to form a pair. The intermediate zone heating apparatuses 4, 5 are also coupled via the distribution parameter C.

$$C = \frac{P_4}{P_5}$$

According to the invention, in each case two zone heating apparatus pairs are coupled to each other in terms of power, wherein this concerns zone heating apparatuses which are disposed symmetrically with respect to a middle zone heating apparatus 1.

With the distribution parameter D, the power which is fed into the pair of zone heating apparatuses can be set as a percentage or, respectively, the power which is fed into one of the two zone heating apparatuses 3 can be set.

$$D = \frac{P_3}{P_{tot}}$$

In an alternative, it is also conceivable to couple, via the fourth parameter, the two pairs of the zone heating apparatuses, thus the zone heating apparatuses 2 and 3, to the zone heating apparatuses 4 and 5.

The susceptor 7 does not necessarily have to have a circular disk shape. It can also be formed from a body that has a flat surface onto which the substrates 15 to be coated can be placed. A central extension, for example in the form of a pin, can protrude from the back side of the susceptor and extend into the coils so that the coupling to the RF field is improved.

Coupling the individual coils can also be carried out in a different way; for example, it is conceivable that directly adjacent coils are coupled to one another.

The above embodiments serve for illustrating the inventions which are covered overall by the patent application and which improve the prior art in each case independently at least by the following feature combinations, namely:

A device, which is characterized by a heating power distributor 12 which receives only the manipulated variable $P_{tot}$ as an input variable and which provides a zone heating power $P_1$, $P_2$, $P_3$, $P_4$, $P_5$ for each of the zone heating apparatuses 1, 2, 3, 4, 5 as output variables, wherein the sum of the values of the zone heating powers $P_1$, $P_2$, $P_3$, $P_4$, $P_5$ corresponds to the manipulated variable $P_{tot}$ and the values of the zone heating powers $P_1$, $P_2$, $P_3$, $P_4$, $P_5$ have a fixed ratio with respect to one another, characterized in that the specified ratios can be changed by preselectable distribution parameters A, B, C, D.

A device, which is characterized in that at least one distribution parameter A, C is a quotient of two values of zone heating powers $P_1$, $P_2$; $P_4$, $P_5$.

A device, which is characterized in that the susceptor 7 has a circular disk shape, wherein a plurality of substrate holders 8 is disposed annularly about the center of the susceptor 7, wherein the zone heating apparatuses 1, 2, 3, 4, 5 are disposed annularly about the center of the susceptor 7 in such a manner that a central zone heating apparatus 1 is disposed below the center of the substrate holders 8, a radially inner zone heating apparatus 3 is disposed in the region below the inner edge of the annular arrangement of the substrate holders 8, and a radially outer zone heating apparatus 2 is disposed in the region below the outer edge of the annular arrangement of the substrate holders 8.

A device, which is characterized in that the zone heating powers $P_1$, $P_2$, $P_3$ fed into the radially inner zone heating apparatus 3 have a fixed ratio A with respect to one another.

A device, which is characterized by at least one further pair of zone heating apparatuses 4, 5, in which the zone heating powers $P_4$, $P_5$ fed into the associated zone heating apparatuses 4, 5 have a fixed ratio C with respect to one another.

A device, which is characterized in that the substrate holders 8 can be rotationally driven about their respective center axis.

A device, which is characterized in that the zone heating apparatuses 1, 2, 3, 4, 5 are high-frequency coils for outputting a high-frequency alternating field, which induce eddy currents in the susceptor 7.

A method, which is characterized in that the manipulated variable is divided by a heating power distributor 12 into a plurality of zone heating powers $P_1$, $P_2$, $P_3$, $P_4$, $P_5$, each of which is fed into an associated zone heating apparatus 1, 2, 3, 4, 5, wherein the sum of the zone heating powers $P_1$, $P_2$, $P_3$, $P_4$, $P_5$ is the manipulated variable $P_{tot}$ output by the control apparatus to the heating power distributor 12, and wherein the values of the zone heating powers $P_1$, $P_2$, $P_3$, $P_4$, $P_5$ have a specified, freely selectable fixed ratio with respect to one another.

A method, which is characterized in that the distribution of the total heating power $P_{tot}$ among the individual zone heating powers $P_1$, $P_2$, $P_3$, $P_4$, $P_5$ is carried out according to preselectable distribution parameters A, B, C, D.

A method, which is characterized in that the distribution parameters A, B, C, D are adapted to the type of gas fed into the process chamber.

A method, which is characterized in that the distribution parameters A, B, C, D are adapted to the total gas pressure set in the process chamber.

A method, which is characterized in that the distribution parameters A, B, C, D are adapted to a maximum process temperature.

A method, which is characterized in that temperature ramps are implemented with the distribution parameters A, B, C, D being kept at a fixed value.

A method, which is characterized in that the distribution parameters A, B, C, D are determined through simulation calculations and/or through measurements in preliminary tests.

All features disclosed are (in themselves) pertinent to the invention. The disclosure content of the associated/accompanying priority documents (copy of the prior application) is also hereby included in full, including for the purpose of incorporating features of these documents in claims of the present application. The subsidiary claims in their optional subordinated formulation characterize independent inventive refinement of the prior art, in particular to undertake division applications based on these claims.

REFERENCE LIST 1 zone heating apparatus
2 zone heating apparatus
3 zone heating apparatus
4 zone heating apparatus
5 zone heating apparatus
6 process chamber
7 susceptor
7' top side
7" bottom side
8 substrate holder
9 pocket
10 temperature measuring apparatus
11 controller
12 heating power distributor
13 process chamber ceiling
14 gas inlet
15 substrate
16 centers
A distribution parameter
B distribution parameter
C distribution parameter
D distribution parameter
$P_1$ zone heating power
$P_2$ zone heating power
$P_3$ zone heating power
$P_4$ zone heating power
$P_5$ zone heating power
$P_{tot}$ heating power
$T_S$ susceptor temperature
Z center

What is claimed is:

1. A device for treating substrates, comprising a susceptor (7) which is disposed in a process chamber (6) and has a first side (7') that faces towards the process chamber (6) for accommodating at least one substrate (15) and a second side (7") that faces away therefrom and is heated by a heating apparatus having a plurality of zone heating apparatuses, and comprising a control apparatus, a reference variable of which is a susceptor temperature ($T_S$), a control variable of which is an actual temperature of the susceptor (7) measured by a temperature sensor (10), and a manipulated variable of which is a total heating power ($P_{tot}$) fed into the heating apparatus, comprising a heating power distributor (12) which receives only the total heating power ($P_{tot}$) as an input variable and which provides a zone heating power ($P_1$, $P_2$, $P_3$, $P_4$, $P_5$) for each of the zone heating apparatuses (1, 2, 3, 4, 5) as output variables, wherein a sum of the zone heating powers ($P_1$, $P_2$, $P_3$, $P_4$, $P_5$) corresponds to the total heating power ($P_{tot}$), wherein the zone heating powers ($P_1$, $P_2$, $P_3$, $P_4$, $P_5$) have specified ratios with respect to one another, wherein the specified ratios are specified by pre-selected distribution parameters (A, B, C, D), wherein the susceptor (7) has a circular disk shape, wherein a plurality of substrate holders (8) is disposed annularly about a center of the susceptor (7), each of the substrate holders (8) having a rotational axis and being configured to rotate about said rotational axis, wherein the zone heating apparatuses (1, 2, 3, 4, 5) are disposed annularly about the center of the susceptor (7) in such a manner that a middle one of the zone heating apparatuses (1) is disposed below respective centers of the substrate holders (8), a radially inner one of the zone heating apparatuses (3) is disposed in a region below an inner edge of the annular arrangement of the substrate holders (8), and a radially outer one of the zone heating apparatuses (2) is disposed in a region below an outer edge of the annular arrangement of the substrate holders (8), wherein a first one of the pre-selected distribution parameters (A, C) (i) is a quotient of the zone heating power fed into the radially outer zone heating apparatus (2) and the zone heating power fed into the radially inner zone heating apparatus (3), and (ii) controls a temperature of respective circumferential edge zones of the substrate holders (8), wherein the radially outer zone heating apparatus (2) is radially non-adjacent to the radially inner zone heating apparatus (3), and wherein a second one of the pre-selected distribution parameters (B) (i) specifies a ratio of the zone heating power ($P_1$) fed into the middle zone heating apparatus (1) to the total heating power ($P_{tot}$), and (ii) controls a temperature of respective central zones of the substrate holders (8).

2. The device according to claim 1, further comprising at least one further pair of zone heating apparatuses (4, 5), in which the zone heating powers ($P_4$, $P_5$) fed into the further pair of zone heating apparatuses (4, 5) have a specified ratio (C) with respect to one another.

3. The device according to claim 1, wherein the zone heating apparatuses (1, 2, 3, 4, 5) are high-frequency coils for outputting a high-frequency alternating field, which induce eddy currents in the susceptor (7).

4. A method for treating substrates, in which at least one substrate (15) is disposed on a first side (7') of a susceptor (7) which is disposed in a process chamber (6) and the second side (7") of which facing away from the first side (7') is heated by a heating apparatus having at least three zone heating apparatuses (1, 2, 3, 4, 5) annularly disposed about a center of the susceptor (7), wherein a total heating power ($P_{tot}$) fed into the heating apparatus is controlled by a controller (11), a reference variable of which is a susceptor temperature ($T_S$), a control variable of which is an actual temperature of the susceptor (7) measured by a temperature sensor (10), and a manipulated variable of which is only the total heating power ($P_{tot}$), wherein a heating power distributor (12) feeds a zone heating power ($P_1$, $P_2$, $P_3$, $P_4$, $P_5$) into each of the zone heating apparatuses (1-5), a sum of which is the total heating power ($P_{tot}$), and wherein the distribution of the total heating power ($P_{tot}$) among the individual zone heating powers ($P_1$, $P_2$, $P_3$, $P_4$, $P_5$) is carried out according to pre-selected distribution parameters (A, B, C, D), wherein on the first side (7') of the susceptor (7), a plurality of substrate holders (8) is disposed annularly about the center of the susceptor (7), each of the substrate holders (8) having a rotational axis and being configured to rotate about said rotational axis, wherein a middle one of the zone heating apparatuses (1) is disposed below the respective centers of the substrate holders (8), a radially inner one of the zone heating apparatuses (3) is disposed in a region below an inner edge of the annular arrangement of the substrate holders (8), and a radially outer one of the zone heating apparatuses (2) is disposed in a region below an outer edge of the annular arrangement of the substrate holders (8), wherein a first one of the pre-selected distribution parameters (A, C) (i) is a quotient of the zone heating power fed into the radially outer zone heating apparatus (2) and the zone heating power fed into the radially inner zone heating apparatus (3), and (ii) controls a temperature of respective circumferential edge zones of the substrate holders (8), wherein the radially outer zone heating apparatus (2) is radially non-adjacent to the radially inner zone heating apparatus (3), and wherein a further one of the pre-selected distribution parameters (B) (i) specifies a ratio of the zone heating power ($P_1$) fed into the middle zone heating apparatus (1) to the total heating power ($P_{tot}$), and (ii) controls a temperature of respective central zones of the substrate holders (8).

5. The method according to claim 4, further comprising at least one further pair of zone heating apparatuses (4, 5), wherein the zone heating powers ($P_4$, $P_5$) fed into the at least one further pair of zone heating apparatuses (4, 5) have a specified ratio (C) with respect to one another.

6. The method according to claim 4, wherein the pre-selected distribution parameters (A, B, C, D) are adapted to a total gas pressure set in the process chamber (6).

7. The method according to claim 4, wherein the pre-selected distribution parameters (A, B, C, D) are adapted to a maximum process temperature.

8. The method according to claim 4, wherein temperature ramps are implemented with the pre-selected distribution parameters (A, B, C, D) being kept at a fixed value.

9. The method according to claim 4, wherein the pre-selected distribution parameters (A, B, C, D) are determined through simulation calculations.

10. The method according to claim 4, wherein the pre-selected distribution parameters (A, B, C, D) are determined through measurements in preliminary tests.

11. The method according claim 4, wherein the pre-selected distribution parameters (A, B, C, D) are determined through simulation calculations and through measurements in preliminary tests.

* * * * *